United States Patent
Biber et al.

(10) Patent No.: US 9,612,304 B2
(45) Date of Patent: Apr. 4, 2017

(54) MAGNETIC RESONANCE APPARATUS WITH WIRELESS TRANSMISSION FROM MRI RECEIVE COILS TO RECEIVER

(75) Inventors: Stephan Biber, Erlangen/Frauenaurach (DE); Klaus Huber, Effeltrich (DE)

(73) Assignee: Siemens Aktiengesellschaft, München (DE)

( * ) Notice: Subject to any disclaimer, the term of this patent is extended or adjusted under 35 U.S.C. 154(b) by 959 days.

(21) Appl. No.: 13/604,550

(22) Filed: Sep. 5, 2012

(65) Prior Publication Data
US 2013/0241547 A1 Sep. 19, 2013

(30) Foreign Application Priority Data

Sep. 6, 2011 (DE) .................. 10 2011 082 190

(51) Int. Cl.
*G01R 33/36* (2006.01)
*G01R 33/3415* (2006.01)

(52) U.S. Cl.
CPC ..... *G01R 33/3692* (2013.01); *G01R 33/3415* (2013.01); *G01R 33/3664* (2013.01)

(58) Field of Classification Search
USPC .................. 324/300–322; 600/407–435; 382/128–131
See application file for complete search history.

(56) References Cited

U.S. PATENT DOCUMENTS

| 7,764,065 | B2 | 7/2010 | Biber et al. ................ 324/318 |
| 7,924,007 | B2 * | 4/2011 | Arnold et al. ............... 324/309 |
| 2007/0182409 | A1 | 8/2007 | Varjo |
| 2008/0211502 | A1 * | 9/2008 | Arnold et al. ............... 324/318 |
| 2009/0096456 | A1 | 4/2009 | Biber et al. |
| 2009/0267601 | A1 | 10/2009 | Helvoort et al. |
| 2009/0286478 | A1 | 11/2009 | Biber et al. |
| 2009/0315556 | A1 | 12/2009 | Driemel et al. |
| 2010/0259261 | A1 * | 10/2010 | Saes et al. ......... G01R 33/3621 324/309 |

(Continued)

FOREIGN PATENT DOCUMENTS

| CN | 1985184 A | 6/2007 |
| CN | 101052890 A | 10/2007 |

(Continued)

OTHER PUBLICATIONS

German Office Action dated Jun. 11, 2012 for corresponding German Patent Application No. DE 10 2011 082 190.2 with English translation.

(Continued)

*Primary Examiner* — Melissa Koval
*Assistant Examiner* — Tiffany Fetzner
(74) *Attorney, Agent, or Firm* — Lempia Summerfield Katz LLC

(57) ABSTRACT

A magnetic resonance apparatus includes receive coils and a receiver device for processing magnetic resonance signals received by coil elements of the receive coils. The receive coils are subdivided into at least a first group having at least one receive coil and a second group having at least one receive coil. The receive coils of the first group are connected to the receiver device via a hardwired communications link, and the receive coils of the second group are each connectable or connected to the receiver device via a wireless communications link.

19 Claims, 7 Drawing Sheets

(56) References Cited

U.S. PATENT DOCUMENTS

2011/0012598 A1    1/2011   van Helvoort et al.
2012/0187949 A1    7/2012   Biber et al. .................. 324/322
2013/0241547 A1*   9/2013   Biber et al. .................. 324/307

FOREIGN PATENT DOCUMENTS

| CN | 101581771 A | 11/2009 |
|----|---|---|
| CN | 101609133 A | 12/2009 |
| CN | 201384492 Y | 1/2010 |
| DE | 10 2007 047 020 A1 | 4/2009 |
| DE | 10 2010 027 673 A1 | 1/2012 |

OTHER PUBLICATIONS

Chinese Office action for Related Chinese Application No. 201210314433.5 dated Sep. 2, 2015 with English Translation.
Heid O., et.al., "Cutting the Cord—Wireless Coils for MRI," in: Proc. Intl. Soc. Mag. Reson. Med., vol. 17, p. 100, 2009.
http://www.healthcare.philips.com/main/products/mri/systems/Ingenia15T/features.wpd, Version: 12. Dec. 2010, 2004.
http://www.healthcare.philips.com/main/products/mri/systems/Ingenia15T/specifications.wpd, Version: 11. Dec. 2010.
Martius, S., et.al., "Wireless Local Coil Signal Transmission Using a Parametric Upconverter," in: Proc. Intl. Soc. Mag. Reson. Med., vol. 17, p. 2934, 2009.
Riffe MJ, et.al., "Power scavenging circuit for wireless DC power," in: Proc. Intl. Soc. Mag. Reson. Med., vol. 15, p. 3273, 2007.

* cited by examiner a# MAGNETIC RESONANCE APPARATUS WITH WIRELESS TRANSMISSION FROM MRI RECEIVE COILS TO RECEIVER This application claims the benefit of DE 10 2011 082 190.2, filed on Sep. 6, 2011.

BACKGROUND

The present embodiments relate to a magnetic resonance apparatus including receive coils and a receiver device for processing magnetic resonance signals received by coil elements of the receive coils.

In magnetic resonance imaging (MRI), nuclear spins are excited by a radio-frequency field of a transmit coil. Magnetic resonance signals that are emitted by the nuclear spins may be captured by a receive coil and evaluated in order to calculate magnetic resonance images. In such applications, magnetic resonance coils may also be embodied simultaneously as transmit coil and as receive coil.

In situations where magnetic resonance images having a high signal-to-noise ratio are to be acquired, coil elements referred to as "local coils" (e.g., antenna systems that are arranged directly on the object (a patient) that is to be scanned) may be used in MRI. Local coils may be positioned on the patient (e.g., anterior arrangement) or under the patient (e.g., posterior arrangement). If a magnetic resonance measurement is to be performed, the excited nuclei induce a voltage (e.g., the magnetic resonance signal) in the individual coil elements of the local coil. The magnetic resonance signal is amplified by a low-noise preamplifier (LNA) and forwarded to a receiver device (e.g., receive electronics). The signal-to-noise ratio may be improved by using strong static magnetic fields (e.g., in the range from 1.5 T to 12 T).

In such applications, the coil elements of the local coils may be embodied as very small, since this also improves the signal-to-noise ratio. Accelerated measurement methods, in which k-space undersampling is performed, for example, within the framework of parallel imaging, have also been proposed. For these reasons, very dense arrays of coil elements have been proposed. The coil elements may have completely different orientations relative to the transmit field. A plurality of transmission channels or transmission options may be used in order to enable this large number of coil elements to be read out. This transmission may take place by way of a hardwired communications link (e.g., a coaxial cable) In this case, a switching device may be provided if the number of coil elements exceeds the number of input channels provided on the receiver device side.

The high numbers of channels to be transmitted and the high dynamics of magnetic resonance imaging make it difficult to implement wireless receive coils (e.g., wireless local coils). Wireless local coils have a plurality of advantages. In addition to a positive marketing effect, wireless local coils have a significant advantage in terms of workflow and in patient comfort owing to the absence of cables. This applies, for example, since in magnetic resonance technology, the cables are to be provided with devices known as standing wave traps that are intended to prevent danger to patients caused by common-mode currents on the sheaths of the coaxial cables. The standing wave traps make the cables thick and heavy.

Cableless local coils, which accordingly operate using a wireless communications link, have already been proposed in principle. Solutions, in which along the lines of MIMO technology, signals of a plurality of coil elements may also be transmitted collectively, are known (cf., DE 10 2007 047 020 A1). However, an approach of this kind may no longer be implemented in the case of a digitization of the magnetic resonance signals on the receive coil side, as has been proposed more frequently in recent times. If the magnetic resonance signals are already digitized on the receive coil side, a separate transmit channel for wireless transmission is to be made available for each coil element having magnetic resonance signals that are to be transmitted.

SUMMARY AND DESCRIPTION

Concepts for magnetic resonance apparatus that permit a wireless transmission of the magnetic resonance signals of a plurality of coil elements (e.g., in the case of digitization on the coil side) are unknown in the related art. There are limits on the realization of such a magnetic resonance apparatus (e.g., with regard to the large bandwidths and high frequencies required).

The present embodiments may obviate one or more of the drawbacks or limitations in the related art. For example, a magnetic resonance apparatus, with which a wireless communications link is realized and which is optimized in terms of a requisite investment in transmission resources and from a cost perspective, is provided.

In one embodiment of a magnetic resonance apparatus, receive coils are subdivided into at least a first group having at least one receive coil and a second group having at least one receive coil. The receive coils of the first group are each connected to a receiver device by way of a hardwired communications link, and the receive coils of the second group are each connectable or connected to the receiver device by way of a wireless communications link.

In one embodiment, a system architecture for a magnetic resonance apparatus, in which only some of the receive coils are connected to the system wirelessly (e.g., without the use of cables), is provided. All the other receive coils transmit magnetic resonance signals (e.g., in analog and/or digital form) in a conventional cable-based manner to the amplifier device. The wireless transmission is consequently used for such receive coils, for which this is beneficial and for which the advantages with respect to ease of handling and patient comfort are also given. The first group may include all posterior local coils, all local coils integrated into a patient couch, and/or all local coils that may be placed onto the patient couch by a connection mechanism. Coils that are already "permanently" integrated or are to be placed under a patient (e.g., put in position on the couch before the patient arrives) and coils, for which the infrastructure for a simple connection is already provided on the patient couch, may each continue to make use of the cabling infrastructure that may be realized in a known manner with little disruption (e.g., the hardwired communications link). Such receive coils of the first group already possess a fixed contact to the magnetic resonance apparatus, so the receive coils offer few advantages when implemented using wireless technology (e.g., the omission of the hardwired energy supply and the associated choking of the cables to prevent the propagation of common-mode currents may be cited as relatively minor advantages).

In one embodiment, the second group includes all anterior local coils, all freely positionable local coils, and/or local coils that are to be deployed for specific applications only. All anterior receive coils and all receive coils, for which it is important that the receive coils may be placed at arbitrary positions on the couch, may be coupled to the magnetic resonance apparatus (e.g., the receiver device) by way of a wireless communications link. The second group may, however, also include receive coils that are required only extremely rarely and for this reason, are first still to be connected to the system that, for example, provides no defined, fixed infrastructure for the connection.

The present embodiments enable the maximum number of channels to be transmitted by radio to be reduced significantly (e.g., by as much as 50 percent) because large parts of a patient to be examined lie on the receive coils that may be integrated in the patient couch or are scanned by receive coils that may be easily coupled to the system by way of a connection mechanism that may also include the connecting leads. Reducing the number of channels to be transmitted by radio is important because the high bandwidth requirement is problematic (e.g., in the case of digital wireless transmission). High bandwidths use high transmission frequencies that in the range of >10 GHz, for example, are associated with high costs that, depending on the transmission technology used, increase (e.g., for 24 GHz, 60 GHz, 77 GHz or 94 GHz). When such high frequencies are used, expensive receive technology on the receiver device side or connected upstream of the receiver device and a high energy supply capacity to the receive coils that are intended to transmit wirelessly are used, since generating transmit power for the wireless communications link in the receive coil becomes more inefficient as the transmission frequency increases.

Using the possible reduction in the maximum number of channels to be transmitted, a significant reduction in the bandwidth requirements, frequency and hence power requirements and costs of the wireless receive coils may be achieved. This is achieved through implementation of a hybrid magnetic resonance receive system, in which only the receive coils are wirelessly connected where this affords an actual advantage, while the other receive coils may be connected to the system by way of already known hardwired technologies.

The present embodiments yield a particularly advantageous effect if at least some of the receive coils include a digitizing device for digitizing the magnetic resonance signals inside the receive coil. Following the digitization, each digitized magnetic resonance signal and, consequently, each coil element is assigned a channel for transmission purposes. Advantageously, the digitization permits a more robust radio transmission.

At least one receive coil may include a plurality of individual coil elements having magnetic resonance signals that may be transmitted individually and/or combined into groups. A multiplexer may be provided for combining the signals into groups. Receive coils including, for example, 32 coil elements may be used. The 32 coil elements may be combined into four groups, each having eight coil elements having magnetic resonance signals that are combined by way of a multiplexer. Where appropriate, the multiplexer may be followed by a signal compression device, with all of the thus combined signals in the "front end" being supplied to an analog-digital converter (ADC). Following an optional digital signal processing stage, the magnetic resonance signals may be transmitted by way of the coil-side transmitting device. In the above-cited embodiment, for example, four 8-channel frontends may be provided. Outputs of the four 8-channel frontends are all supplied to a 4-channel ADC.

For the coils of the first group, conventional, well-established methods for hardwired signal transmission may be used. Thus, for example, at least one hardwired communications link may include an optical and/or electrical transmission section. Accordingly, the hardwired communications links take the form, for example, of fiber optic cables and/or electrically conductive wires. The corresponding connection options are known in the prior art and require no further explanation here.

The wireless transmission of the magnetic resonance signals may also be associated with the desire for a total absence of cabling in the corresponding receive coils. In one embodiment, the receive coils of the second group include at least one coil element that is embodied for receiving energy transmitted by a transmit antenna for energy (e.g., a transmit bodycoil of the magnetic resonance apparatus). In this case, the coil element may be one of the coil elements serving to receive the magnetic resonance signals, although a dedicated coil element that is embodied solely for receiving energy may also be provided. Concepts have already been proposed to use an already present whole-body transmit coil of the magnetic resonance apparatus for transmitting energy to wireless local coils, although the transmission may be performed by additional, dedicated transmit antennas.

With one embodiment of the magnetic resonance apparatus, the number of input channels of the receiver device may correspond to the number of coil elements provided by the receive coils. In this case, no selection of the channels to be used or no assignment of coil elements to input channels takes place. The magnetic resonance signals measured by a coil element may, however, be selected in software on an image processor or on a digital component connected upstream of the image processor.

All the magnetic resonance signals of all the coil elements may not be used for a particular magnetic resonance measurement. Only the magnetic resonance signals that also originate from the current field of view may be used for the particular magnetic resonance measurement. Accordingly, providing input channels, processing modules and transmission bandwidth for all the coil elements would entail a large and ultimately, unnecessary investment of resources.

In one embodiment, the number of coil elements provided by the receive coils for magnetic resonance signals is greater than the number of input channels of the receiver device. A switching device is provided for assigning coil elements that are to be read out to input channels. In one embodiment, an adaptation of the concept of using only hardwired communications links for a magnetic resonance apparatus is used, since the magnetic resonance signals are transmitted in different ways. The adaptation may also be used for the advantageous development of the magnetic resonance apparatus according to one embodiment.

In one embodiment, a combining device including, for example, a signal conversion device for the signals of the first and the second group is provided on the receiver device side for the magnetic resonance signals transmitted by the receive coils. In the receiver device, the signals that are present in physically different form (e.g., electrical/optical, analog/digital, different frequency positions, different multiplexing concepts), are consequently converted into an identical physical and logical format and supplied to input channels that are, for example, the same for all signal paths. In order to select or assign magnetic resonance signals to receive channels so that input channels may be saved, the switching device may include a switching matrix arranged downstream of the combining device for the purpose of selecting the magnetic resonance signals that are to be evaluated. In this embodiment, a central switching matrix, to which all signals (e.g., converted to the same format) are supplied, is provided.

Alternatively or additionally, the switching device for the first and/or the second group includes a preselection device for selecting magnetic resonance signals that are to be transmitted to the receiver device. In one embodiment, the preselection device may be two separate switching matrices that are connected upstream of the combining device. This may be advantageous, since by using preselection devices arranged as far as possible upstream in the direction of the coil, the receiver chain may be reduced at an early stage to the hardware that is actually required.

In one embodiment, the preselection device of the second group is embodied for dynamically assigning coil elements that are to be read out and/or coil element groups to wireless transmission channels (e.g., frequency ranges). A specific number of transmission channels, to which the coil elements that are actually to be read out may be dynamically allocated, are held in reserve. The advantage derived herefrom is that a further significant reduction in the number of required transmission channels and consequently the required total bandwidth for transmission may be achieved, since normally no situation, in which all the coil elements involved are required simultaneously for magnetic resonance imaging (e.g., all acquiring data in the field of view), occurs. On the second group side, therefore, all wirelessly connected receive coils (e.g., local coils) are dynamically configured such that only the coil elements that are currently intended to receive transmit the respective magnetic resonance signal wirelessly to the receiver device. The preselection takes place at the time of coil selection. Since the interface to the receiver device is wireless, the number of receive coils that may be used simultaneously in the magnetic resonance apparatus is arbitrarily high because this number is no longer limited by the number of slots present on the patient couch. Thus, for example, ten coils each having 32 coil elements may be used on a patient couch that has only two slots. The ten receive coils are read out wirelessly. In this case, depending on the capacity of the wireless interface (e.g., ultimately the available bandwidth), one or two receive coils may always be read out simultaneously. In this case, a finer subdivision may be used (e.g., to provide only partial transmission bandwidths and to instruct a receive coil to transmit only the magnetic resonance signals of the corresponding part (a group) of coil elements). Other receive coils are not active at all, because either the receive coils have been configured accordingly, or for example, due to the position, the receive coils are not being supplied with energy. The two slots mentioned in the example may be used for posterior receive coils of the first group (e.g., a spine receive coil and/or a head/neck coil). A preselection, for example, using a switching matrix as a preselection device may continue to take place for the coils of the first group.

In another embodiment, in connection with the dynamic assignment, the receive coils may include at least one control device that may be operated by way of externally supplied energy and is embodied for transmitting a coil-specific identification signal (e.g., in response to a query signal of a control device of the preselection device controlling the reception of signals over the wireless communications link and/or the dynamic assignment). For this reason, on the coil side, a certain electronic entity that is able to identify the corresponding receive coil in order to permit a selective allocation of transmission channels is provided. For the controller, a kind of "downlink" to the receive coils, via which the receive coils may be activated/deactivated and, for example, also via which queries may be sent, exists. The coil identification takes place by way of the same digital interface, via which the magnetic resonance signals are also sent (e.g., data uplink). For this purpose, each receive coil may be assigned a receive-coil-specific digital address. In one embodiment, the receive coil, although being embodied to respond as soon as the receive coil receives wireless energy, does not send identification or other data unsolicited. Instead, at what time a check will be made to determine whether and which receive coils are available is decided on the part of the control device of the preselection device (e.g., under the control of an overall control device of the magnetic resonance apparatus). Requests of the type may be made, for example, at the time of a displacement of the patient couch, for example.

In one embodiment, 64 existing transmission channels, for example, are subdivided into 8 sub-bands (e.g., frequency ranges), with individual groups of coil elements being allocated dynamically to specific sub-bands by the preselection device. The information relating to the allocation is sent over the downlink to the respective receive coil.

A transmit antenna for energy embodied for transmitting energy to the receive coils of the second group may be embodied as longer than a transmit coil (e.g., a whole-body transmit coil) in the longitudinal direction of a patient receptacle of the magnetic resonance apparatus (e.g., projecting beyond the transmit coil on both sides). The whole-body transmit coil or other transmit coil ultimately defines the field of view for a magnetic resonance projection. The receive coils of the second group may be supplied with energy before the receive coils enter the actual field of view (e.g., in the course of a movement of the patient couch). In this way, the receive coils of the second group may be identified at an early stage (e.g., by a corresponding response to a query) and taken into consideration when the receive coils are later moved into the field of view (e.g., in the course of an overview projection or within the framework of another series of projections).

Lower transmission frequencies are permitted to be used for the wireless communications link. Thus, the radio frequency for the wireless communications link may be below 10 GHz. This is possible because lower bandwidths are used, since the number of channels decreases as a result of the hybrid embodiment (e.g., may be reduced even further by a dynamic assignment of coil elements to transmission channels).

In one embodiment, a plurality of receive antennas are provided for the purpose of receiving magnetic resonance signals transmitted over the wireless communications link. Downstream of the receive antennas, a selection device for selecting the magnetic resonance signals received by one of the receive antennas is connected. An embodiment of this type may also be referred to as a diversity receive system. The use of such a diversity receive system counteracts signal losses caused by unfavorable propagation conditions in the patient receptacle (e.g., a multipath propagation) through provision of receive antennas at a number of different positions, with only the qualitatively highest-value signal being forwarded.

In one embodiment, a method for operating a magnetic resonance apparatus for acquiring magnetic resonance signals using a plurality of receive coils is provided. Magnetic resonance signals of a first group of receive coils are transmitted over a hardwired connection to a receiver device, and magnetic resonance signals of a second group of receive coils are transmitted wirelessly to the receiver device. All statements made in relation to the embodiments of the magnetic resonance apparatus may be applied analogously to the method, using which the advantages cited may also be achieved.

DETAILED DESCRIPTION OF THE DRAWINGS

Figure 1:
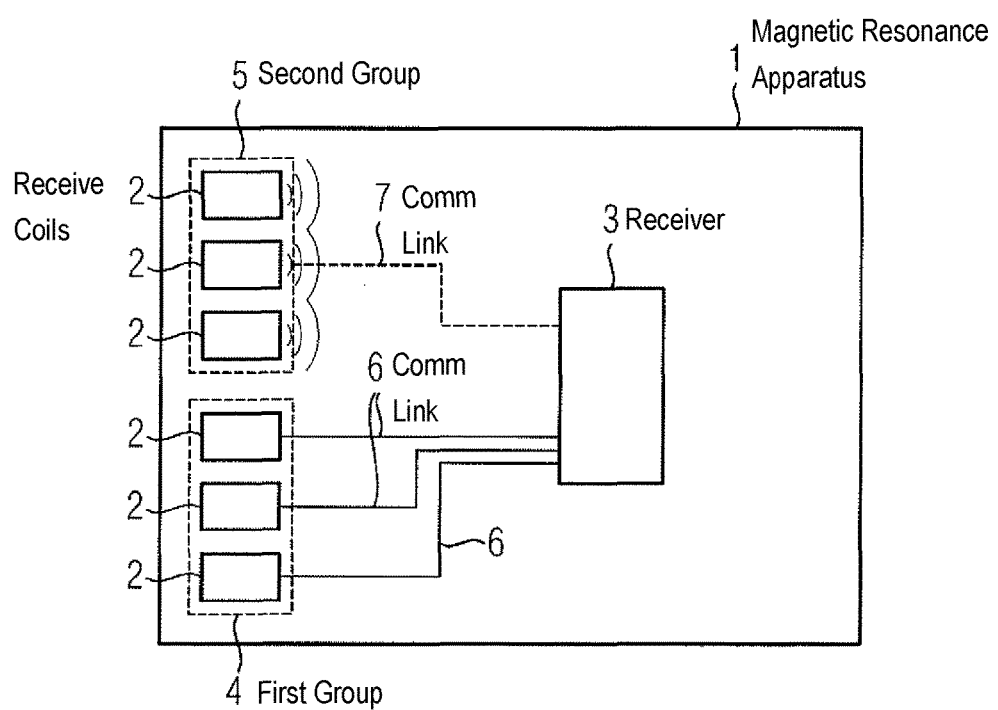
FIG. 1 is a schematic diagram of one embodiment of a magnetic resonance apparatus.

FIG. 1 shows one embodiment of a magnetic resonance apparatus 1 in the form of a rough schematic diagram, in which for clarity of illustration reasons, the fundamentally known components such as the static field magnet, the gradient coils and the like, are not shown.

The magnetic resonance apparatus 1 includes a plurality of receive coils 2 that may each include a plurality of coil elements. In one embodiment, the receive coils 2 are local coils that may be arranged close to a patient that is to be examined. Magnetic resonance signals of at least some of the coil elements of the receive coils 2 are to be transmitted in the usual way to a receiver device 3. In one embodiment, a type of hybrid architecture is provided for the transmission, with the receive coils 2 being subdivided into a first group 4 and a second group 5. The receive coils of the first group 4 are each connected to the receiver device 3 via a hardwired communications link 6 that may include, for example, an optical and/or an electrical transmission section.

In one embodiment, the receive coils of the first group 4 are the posterior local coils and all the local coils integrated into a patient couch (not depicted in FIG. 1 in further detail). Local coils that may be placed onto the patient couch using a connection mechanism (e.g., head coils) are also included in the first group 4. The first group 4 therefore contains all receive coils 2 that are not required to possess the capability to be positioned arbitrarily or to be positioned on the patient.

The receive coils 2 of the second group 5 include all anterior local coils that are to be freely positionable and all other local coils that are to be freely positionable. In other embodiments, required local coils that are intended to be used, for example, only for specific applications may also be included in the second group 5. The signals of the second group 5 are transmitted to the receiver device 3 over a wireless communications link 7 (e.g., a radio link). The signals of the second group 5 are thus either permanently connected to the receiver device 3 via the communications link 7, or the signals of the second group 5 may be connected to the receiver device 3, as necessary.

Since not all receive coils 2 need to transmit the magnetic resonance signals wirelessly, fewer channels are required. A low radio frequency (e.g., less than 10 GHz) may thus be used.

Figure 2:
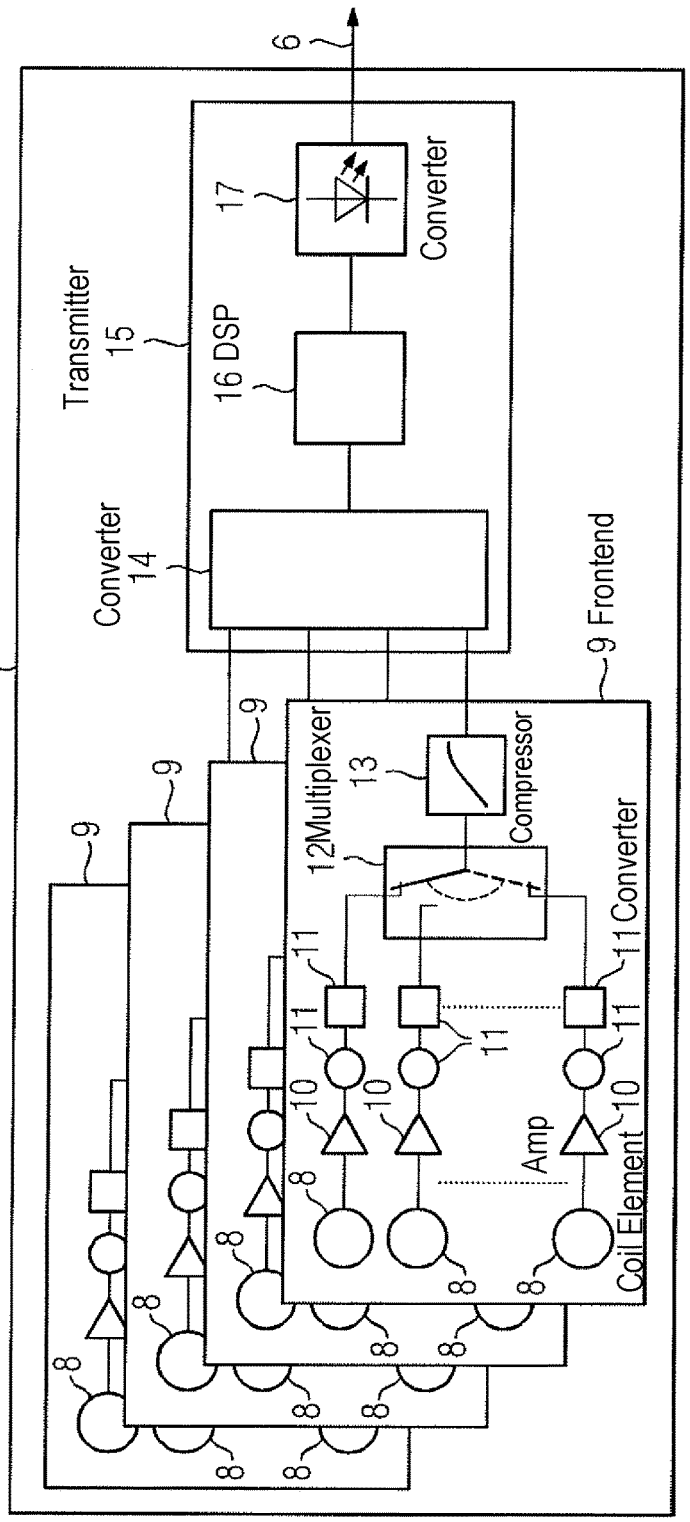
FIG. 2 shows one embodiment of a receive coil of a first group.

FIG. 2 shows, by way of example, a possible embodiment of a receive coil 2 of the first group 4. The receive coil 2 includes a plurality of coil elements 8 (e.g., thirty-two coil elements 8) that are subdivided into four groups of eight coil elements 8 each. Each of the groups of coil elements 8 is assigned to an 8-channel frontend 9, only one of which is shown in its entirety in the foreground for the sake of more simple illustration. The magnetic resonance signals received by the coil elements 8 are first amplified by a low-noise amplifier 10 and converted to an intermediate frequency using a low-noise frequency converter 11. The signals are combined by a multiplexer 12. The multiplexer 12 is followed by a signal compression device 13.

The preprocessed magnetic resonance signals of the frontends 9 are supplied to a common four-channel analog-digital converter 14 of a digitizing and transmitting device 15. Following optional digital signal processing using a digital signal processor (DSP) 16, the digitized signals are supplied to an electro-optical converter device 17 and transmitted over the communications link 6 (e.g., including fiber optic cables) to the receiver device 3.

Figure 3:
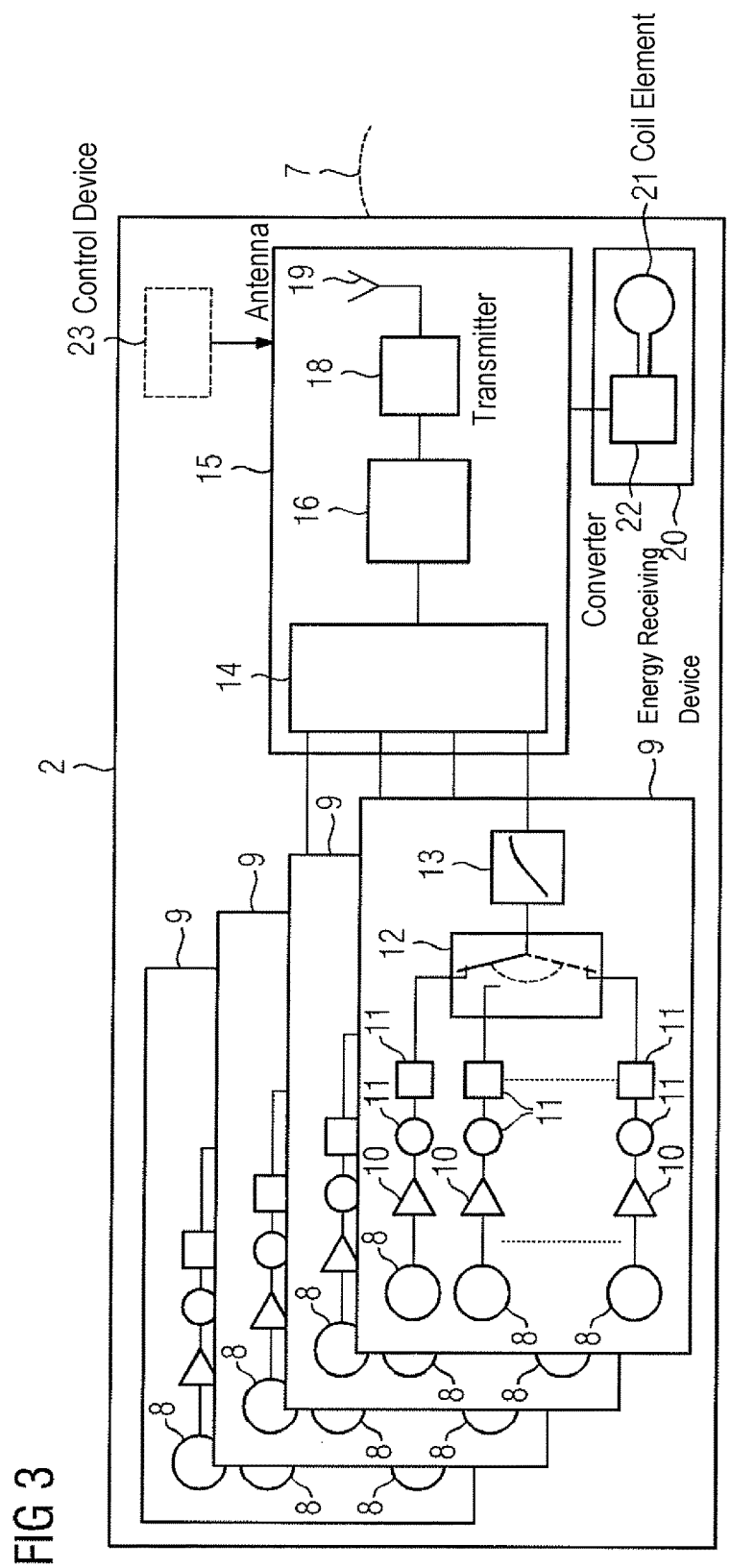
FIG. 3 shows one embodiment of a receive coil of a second group.

FIG. 3 shows an exemplary embodiment of a receive coil 2 of the second group 5. This is essentially identical in design, aside from the fact that a transmit unit 18 having an antenna 19 is provided in the digitizing and transmitting device in order to enable the magnetic resonance signals to be transmitted to the wireless communications link 7.

A receive coil 2 of the second group 5 also includes an energy receiving device 20 that receives the energy transmitted via a transmit antenna for transmitting energy to the receive coils 2 of the second group 5. The energy receiving device 20 has a coil element 21 for receiving the energy. A converter 22 is connected downstream of the coil element 21.

A receive coil 2 of the first group 5 may also include a control device 23 in case a dynamic allocation of transmission channels of the communications link 7 is performed. This is described in greater detail with reference to FIGS. 6 and 7.

In one embodiment, the number of input channels of the receiver device 3 is less than the number of coil elements 8 of all of the receive coils 2. An embodiment for assigning the magnetic resonance signals of coil elements 8 that are to be read out to input signals is therefore provided. A first embodiment is exemplified in the schematic diagram of FIG. 4, which shows the receive system for the magnetic resonance signals transmitted wirelessly over the communications link 7 in more detail.

Figure 4:
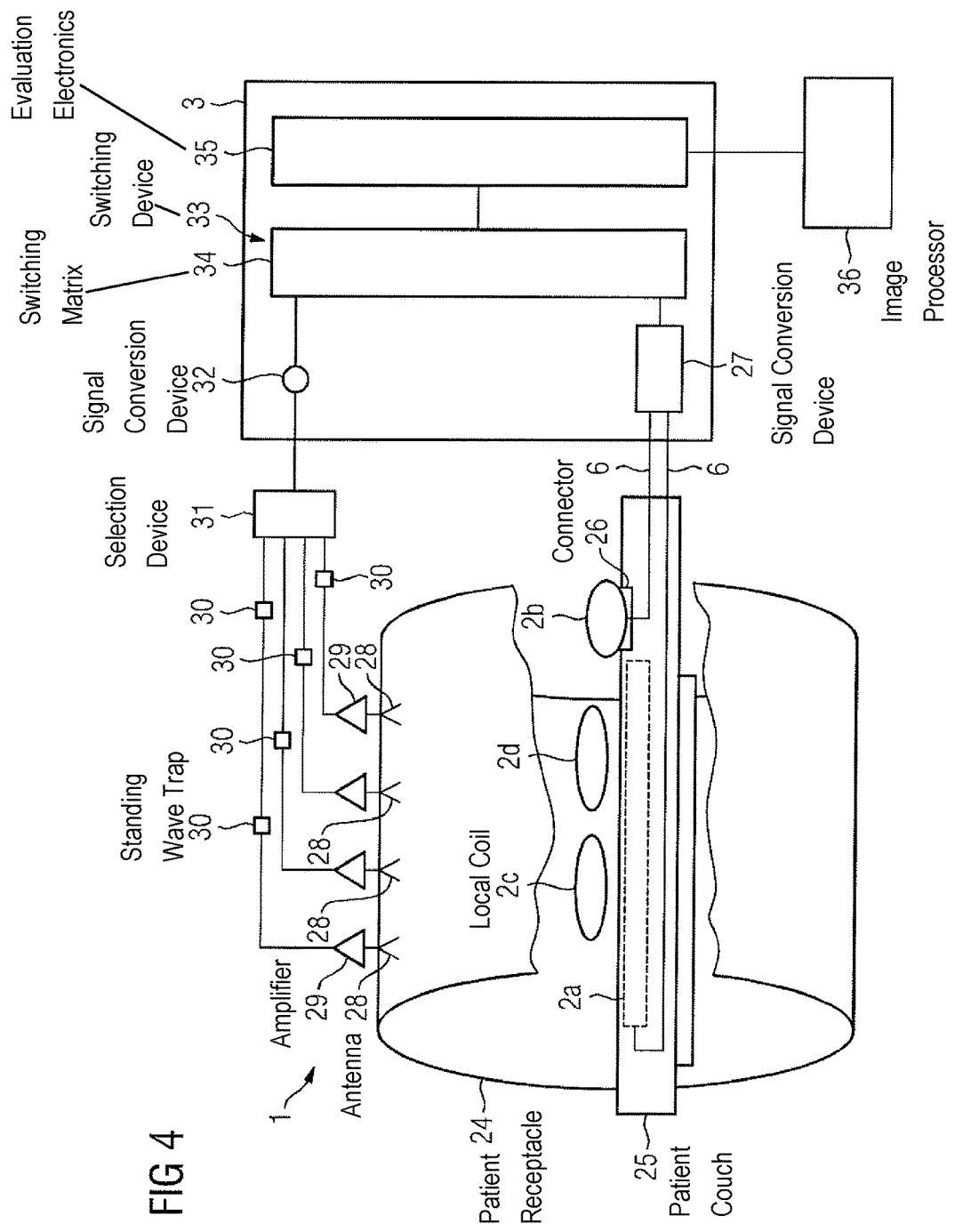
FIG. 4 is a schematic diagram illustrating an exemplary assignment of coil elements to input channels.

Shown in schematic form is the patient receptacle 24 of the magnetic resonance apparatus 1. A patient couch 25 is inserted into the patient receptacle 24. Arranged on the patient couch 25 are two receive coils 2 of the first group 4 (e.g., a posterior spine coil 2a and a head coil 2b) that may be placed onto the patient couch 25 by a corresponding connection mechanism 26. Two anterior, arbitrarily positionable receive coils 2 of the second group 5 (e.g., the local coils 2c and 2d) are also arranged on the patient couch 25. The fiber-optic-containing cables of the hardwired communications links 6 are also shown in FIG. 4. The fiber-optic-containing cables end at a signal conversion device 27 that converts the transmitted magnetic resonance signals to a specific defined format.

Magnetic resonance signals transmitted over the wireless communications link 7 are received by a plurality of antennas 28 that are disposed in a distributed arrangement in the patient receptacle 24. The plurality of antennas 28 form part of a diversity receive system that is intended to compensate for interference caused by reflections inside the patient receptacle 24. The transmissions received by the antennas 28 are amplified by amplifiers 29 and forwarded by cables provided, for example, with standing wave traps 30 to a selection device 31 (e.g., a "diversity selector") that selects the best quality signal for each transmission channel.

The magnetic resonance signals transmitted over the wireless communications link 7 are also supplied to a signal conversion device 32 that also converts these signals to the defined format, so that all the transported magnetic resonance signals are present in the same format. A switching device 33 that is intended to assign the magnetic resonance signals to input channels of the receiver device 3 includes a switching matrix 34 that assigns the magnetic resonance signals that have been converted to the defined format to the input channels of the receiver device 3. The selected magnetic resonance signals are processed further by suitable evaluation electronics 35 and supplied to an image processor 36, where the magnetic resonance image is reconstructed.

Figure 5:
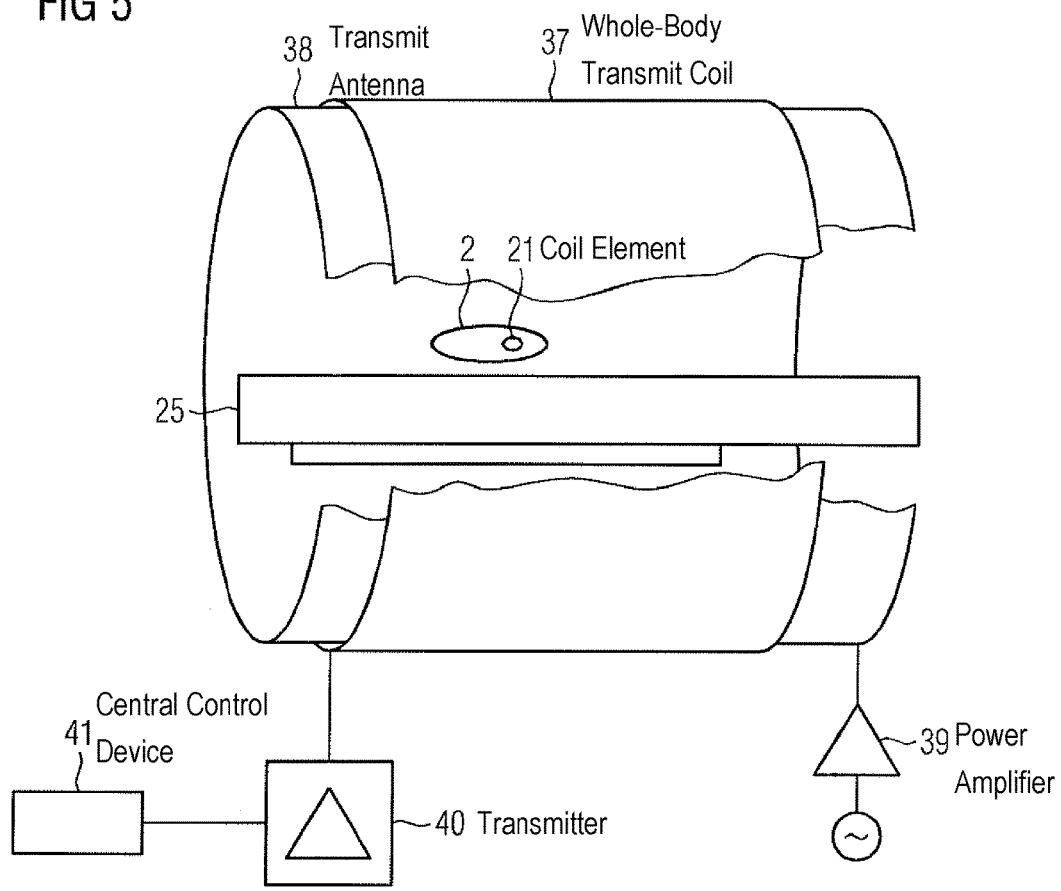
FIG. 5 is a schematic diagram illustrating exemplary transmission of energy to receive coils of the second group.

In one embodiment, the coil elements that are to be read out may be selected at an earlier stage (e.g., in the case of the first group 5, before the transmission over the wireless communications link 7). In order to illustrate this, the transmission of energy to the receive coils 2 of the second group 5 is first explained in more detail with reference to FIG. 5. In the embodiment shown in FIG. 5, the whole-body transmit coil 37 of the magnetic resonance apparatus 1 defining the field of view is shown in a schematic diagram. Embodied longer in the longitudinal direction of the patient receptacle 24 and projecting beyond the field of view of the whole-body transmit coil 37 on both sides, a transmit antenna 38 is provided for transmitting the energy to the receive coils 2 of the second group 5. The energy is transmitted, for example, at a frequency of 5 MHz, for which purpose a corresponding power amplifier 39 is provided. The whole-body transmit coil 37 is energized via a transmitting device 40 in the usual manner by a central measurement monitoring entity of a central control device 41. The energy is received inside the receive coils 2 via the coil element 21.

If the receive coils 2 of the second group 5 include the control device 23, a dynamic assignment of receive coils 2 or groups of coil elements 8 of the receive coils 2 to transmission channels may also be provided. This is explained in more detail with the aid of FIGS. 6 and 7. Owing to the longer embodiment of the transmit antenna 38, the energy field 42, in which the energy may be received, is larger than the field of view 43. Local coils 2 may thus receive energy before the local coils 2 enter the field of view 43 (e.g., during a movement of the patient couch 25, as indicated by the arrow 44). In such a case, the control device 23 consequently also receives an operating current.

Figure 6:
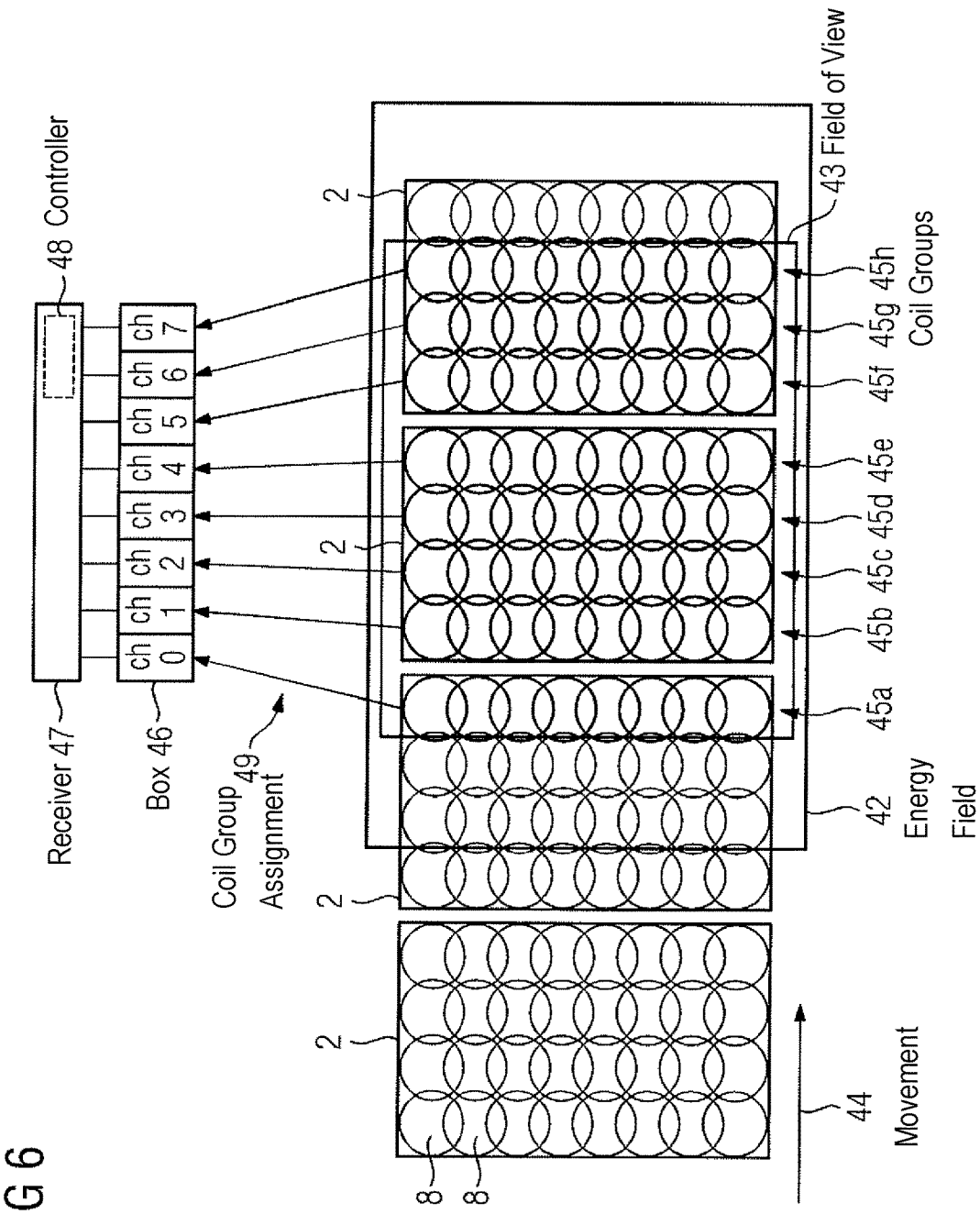
FIG. 6 is a schematic diagram illustrating an exemplary assignment of coil elements to transmission channels at a first instant in time.
Figure 7:
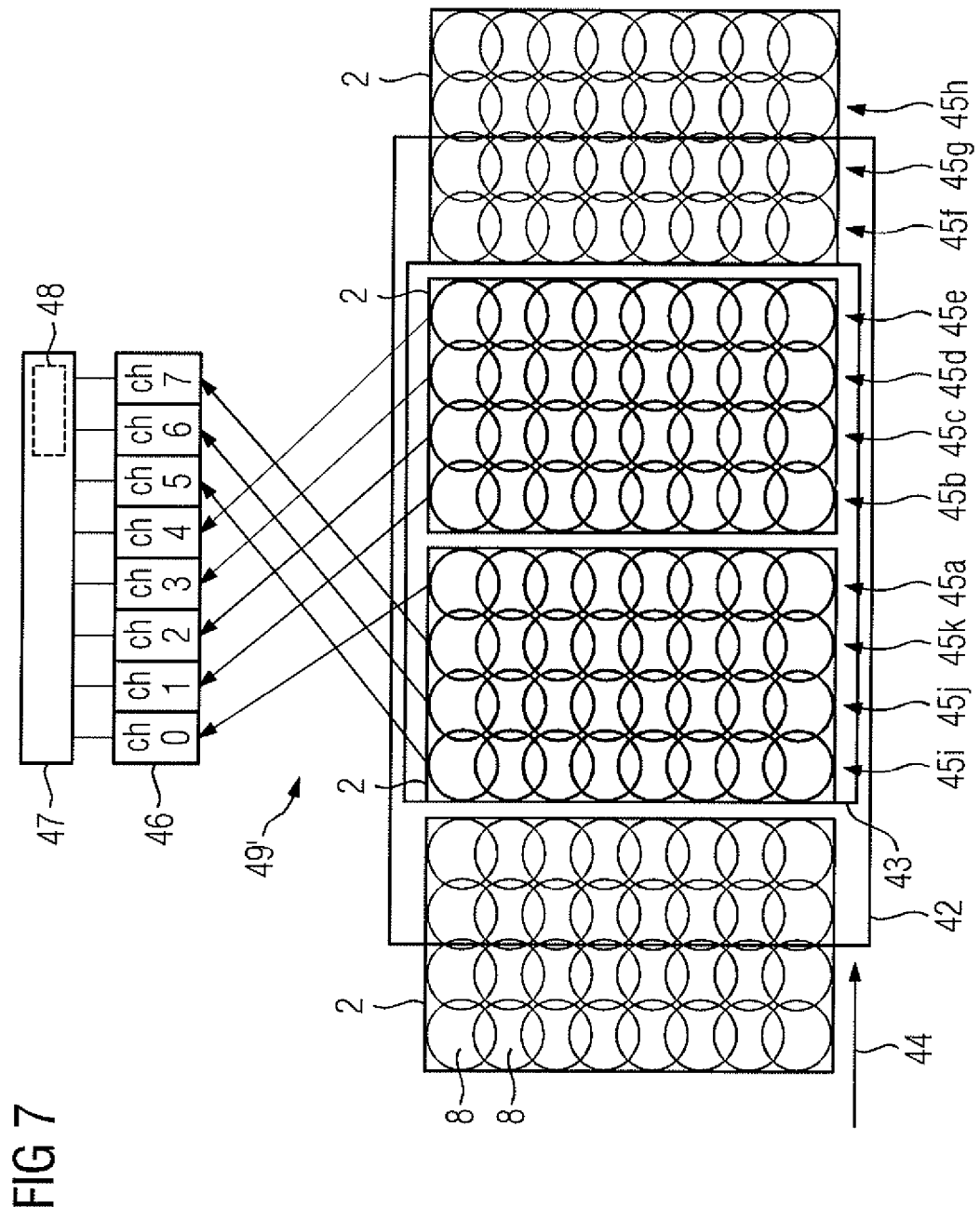
FIG. 7 is a schematic diagram illustrating an exemplary assignment of coil elements to transmission channels at a second instant in time.

In the embodiment shown in FIG. 6, the three receive coils 2 are therefore supplied with energy, although not all the coil elements 8 of the three receive coils 2 are contained within the field of view 43. Only the groups 45a to 45h are located within the field of view 43. For this reason, the received magnetic resonance signals of the groups 45a to 45h are relevant. The received magnetic resonance signals are dynamically allocated transmission channels ch0 to ch7 (e.g., box 46), so that the received magnetic resonance signals may be transmitted to the receiver 47 by the antennas 28. For this purpose, the receiver 47 is also embodied for sending queries and includes, as part of the preselection device, a further control device 48 that, when particular events occur, queries which receive coils 2 are available (e.g., whenever a movement of the patient couch 25 takes place). When such a query is received, the control device 23 sends back an individual digital address of the receive coil 2 if energy is available (e.g., if the receive coil 2 is located in the energy field 42). Based on the information indicating which receive coils 2 are available, the control device 48 may realize the dynamic transmission channel allocation and sends corresponding instructions to the control devices 23. The control devices 23 assign individual coil groups 45a to 45h to transmission channels ch0 to ch7 (e.g., sub-bands or frequency ranges) available. This is indicated by the arrows 49 in FIG. 6. Eight magnetic resonance signals may accordingly be transmitted over each of the transmission channels ch0 to ch7, so that sixty-four magnetic resonance signals may be transmitted in total. The assignment is not tied to receive coils, but as is also for the groups 45a to 45h of coil elements 8, may be carried out such that only some of the groups 45 of some receive coils 2 are actually read out, and the magnetic resonance signals are transmitted onward.

The assignment is dynamically adjustable. This is explained in more detail using the illustration at a second instant in time according to FIG. 7. In this case, the patient couch 25 has been moved further as indicated by the arrow 44. In this example, all four receive coils 2 shown are located inside the energy field 42 (e.g., are supplied with current).

While the groups 45f, 45g and 45h are no longer contained within the field of view 43, the groups 45i, 45j and 45k are contained within the field of view 43. Accordingly, the transmission channels ch5, ch6 and ch7, which have become free, have been assigned, as indicated by the arrows 49', to the coil groups 45i, 45j and 45k that have been newly shifted into the field of view 43.

A constant adjustment is therefore possible by replacing signals of the control device 48, 23.

Although the invention has been illustrated and described in detail on the basis of the exemplary embodiments, the invention is not limited by the disclosed examples. Other variations may be derived herefrom by the person skilled in the art without departing from the scope of protection of the invention.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance apparatus comprising:
   receive coils; and
   a receiver device that processes magnetic resonance signals received by coil elements of the receive coils,
   wherein the receive coils are subdivided into at least a first group having at least one of the receive coils and a second group having at least one of the receive coils, and
   wherein the at least one receive coil of the first group is connected with the receiver device via a hardwired communications link,
   wherein the at least one receive coil of the second group is connectable or connected to the receiver device via a wireless communications link, and
   wherein a radio frequency of the wireless communications link is below 10 GHz during transmission of the received magnetic resonance signals from the at least one coil of the second group to the receiver device after receipt of the magnetic resonance signals at the at least one coil of the second group.

2. The magnetic resonance apparatus as claimed in claim 1, wherein the first group comprises all posterior local coils, all local coils that are integrated into a patient couch, all local coils that are placeable onto the patient couch using a connection mechanism, or a combination thereof, and wherein the second group comprises all anterior local coils, all freely positionable local coils, local coils that are to be deployed for specific applications only, or a combination thereof.

3. The magnetic resonance apparatus as claimed in claim 1, wherein at least some of the receive coils include a digitizing device, the digitizing device being operable to digitize the magnetic resonance signals at a location of or inside the receive coil.

4. The magnetic resonance apparatus as claimed in claim 1, wherein at least one of the receive coils in the first group or the second group comprises a plurality of individual coil elements, and
wherein the magnetic resonance signals of the plurality of individual coil elements are transmittable individually, combined into groups, or individually and combined into groups.

5. The magnetic resonance apparatus as claimed in claim 4, further comprising a multiplexer operable to combine the magnetic resonance signals into the groups.

6. The magnetic resonance apparatus as claimed in claim 1, wherein the number of coil elements that detect magnetic resonance signals, provided by the receive coils is greater than the number of input channels of the receiver device, and
wherein the magnetic resonance apparatus further comprises a switching device that is operable to assign the coil elements that are to be read out to at least some of the input channels.

7. The magnetic resonance apparatus as claimed in claim 6, further comprising, on a receiver device side, a combining device, the combining device comprising a signal conversion device that is operable to convert the magnetic resonance signals of the first group received via the hardwired communications link and the magnetic resonance signals of the second group received via the wireless communications link.

8. The magnetic resonance apparatus as claimed in claim 7, wherein the switching device comprises a switching matrix disposed downstream of the combining device, and
wherein the switching matrix is operable to select the magnetic resonance signals that are to be evaluated.

9. The magnetic resonance apparatus as claimed in claim 6, wherein the switching device switches between the receive coils of the first group, the second group, or the first group and the second group, and
wherein the switching device comprises a preselection device that is operable to select the magnetic resonance signals that are to be transmitted to the receiver device.

10. The magnetic resonance apparatus as claimed in claim 9, wherein the preselection device is configured for at least the second group, and
wherein the preselection device is configured for dynamically assigning coil elements that are to be read out, dynamically assigning coil element groups, or dynamically assigning the coil elements that are to be read out and dynamically assigning the coil element groups to wireless transmission channels.

11. The magnetic resonance apparatus as claimed in claim 10, wherein the preselection device is further configured for assigning frequency ranges.

12. The magnetic resonance apparatus as claimed in claim 10, wherein the receive coils include at least one controller that is operable via externally supplied energy, wherein the controller is configured for transmitting a coil-specific identification signal.

13. The magnetic resonance apparatus as claimed in claim 12, wherein the controller is configured for transmitting the coil-specific identification signal in response to a query signal of a controller of the preselection device controlling the reception of signals over the wireless communications link, the dynamic assignment, or the wireless communications link and the dynamic assignment.

14. The magnetic resonance apparatus as claimed in claim 12, further comprising a transmit antenna configured for transmitting energy, the transmit antenna being longer than a transmit coil in a longitudinal direction of a patient receptacle of the magnetic resonance apparatus.

15. The magnetic resonance apparatus as claimed in claim 14, wherein the transmit coil is a whole-body transmit coil.

16. The magnetic resonance apparatus as claimed in claim 14, wherein the patient receptacle projects beyond the transmit coil on both sides.

17. The magnetic resonance apparatus as claimed in claim 1, further comprising:
a plurality of receive antennas that are operable to receive magnetic resonance signals that are transmitted over the wireless communications link; and
a selection device that is operable to select the magnetic resonance signals that are received by one of the receive antennas, the selection device being connected downstream of the plurality of receive antennas.

18. The magnetic resonance apparatus as claimed in claim 2, wherein at least some of the receive coils include a digitizing device, and
wherein the digitizing device is operable to digitize the magnetic resonance signals at a location of or inside the receive coil.

19. A method of operating a magnetic resonance apparatus in order to acquire magnetic resonance signals using a plurality of receive coils, the method comprising:
transmitting magnetic resonance signals of a first group of receive coils to a receiver device over a hardwired connection; and
transmitting magnetic resonance signals of a second group of receive coils wirelessly to the receiver device,
wherein a radio frequency of a wireless communications link of the wireless transmission is below 10 GHz during the transmitting of the received magnetic resonance signals from the second group of receive coils to the receiver device after receipt of the magnetic resonance signals at the second group of receive coils.

* * * * *